(12) United States Patent
Cheng et al.

(10) Patent No.: US 9,858,366 B2
(45) Date of Patent: Jan. 2, 2018

(54) SIMULATOR AND SIMULATING METHOD FOR FLASH MEMORY BACKGROUND

(71) Applicant: PHISON ELECTRONICS CORP., Miaoli (TW)

(72) Inventors: Kuo-Yi Cheng, Taipei (TW); Yi-Hong Huang, Hsinchu (TW); Huang-Heng Cheng, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 780 days.

(21) Appl. No.: 13/723,114

(22) Filed: Dec. 20, 2012

(65) Prior Publication Data

US 2014/0129206 A1    May 8, 2014

(30) Foreign Application Priority Data

Nov. 5, 2012 (TW) .............................. 101141022 A

(51) Int. Cl.
*G06F 17/50* (2006.01)
*G06F 13/16* (2006.01)
(Continued)

(52) U.S. Cl.
CPC ........ *G06F 17/5022* (2013.01); *G06F 3/0679* (2013.01); *G06F 13/105* (2013.01);
(Continued)

(58) Field of Classification Search
None
See application file for complete search history.

(56) References Cited

U.S. PATENT DOCUMENTS 6,142,682 A * 11/2000 Skogby ................... G06F 9/455
703/26
8,117,587 B1 * 2/2012 Testardi .................. G06F 8/447
717/100
(Continued)

FOREIGN PATENT DOCUMENTS

CN      101256469      9/2008
TW      201227745      7/2012

OTHER PUBLICATIONS

Aeroflex Gaisler, "TSIM2 Simulator Users Manual," Aeroflex Gaisler, Oct. 2012, 67 pages.*

(Continued)

*Primary Examiner* — Kamini S Shah
*Assistant Examiner* — David M Rogers
(74) *Attorney, Agent, or Firm* — JCIPRNET

(57) ABSTRACT

A simulating method for a flash memory and a simulator using the simulating method are provided. The simulator is configured to couple to a memory controller. The simulating method includes: setting a predetermined response condition; providing multiple command sets, wherein each of the command sets corresponds to a memory type; receiving a first command from the memory controller; identifying a second command in the command sets according to the first command; determining if the second command matches the predetermined response condition; obtaining a first signal corresponding to the second command according to the predetermined response condition; and, transmitting the first signal to the memory controller. Accordingly, the usage of the simulator is flexible.

17 Claims, 4 Drawing Sheets

(51) Int. Cl.
  *G06F 13/10*   (2006.01)
  *G06F 3/06*   (2006.01)
  *G06F 12/02*   (2006.01)
  *G06F 12/06*   (2006.01)
  *G06F 9/455*   (2006.01)

(52) U.S. Cl.
  CPC .......... *G06F 13/1694* (2013.01); *G06F 9/455* (2013.01); *G06F 12/0238* (2013.01); *G06F 12/0246* (2013.01); *G06F 12/0638* (2013.01); *G06F 17/5027* (2013.01); *G06F 2212/151* (2013.01); *H01L 2924/1438* (2013.01); *H01L 2924/14511* (2013.01)

(56) References Cited

U.S. PATENT DOCUMENTS

| | | | |
|---|---|---|---|
| 9,026,424 B1* | 5/2015 | Libby | G06F 9/455 703/26 |
| 2002/0095280 A1* | 7/2002 | Tung | G06F 11/261 703/24 |
| 2006/0075395 A1 | 4/2006 | Lee | |
| 2007/0118713 A1* | 5/2007 | Guterman | G06F 3/0607 711/170 |
| 2007/0291552 A1* | 12/2007 | Khatami | G11C 16/20 365/185.33 |
| 2009/0048819 A1* | 2/2009 | Norman | G06F 12/0638 703/23 |
| 2009/0049339 A1* | 2/2009 | Cases | G06F 11/2733 714/29 |
| 2009/0106487 A1* | 4/2009 | Kruecken | G06F 13/1668 711/103 |
| 2010/0011161 A1* | 1/2010 | Norman | G06F 13/1694 711/103 |
| 2010/0250875 A1* | 9/2010 | Leung | G11C 16/102 711/155 |
| 2011/0185116 A1* | 7/2011 | Norman | G06F 12/0246 711/103 |
| 2012/0204078 A1* | 8/2012 | Hall | G06F 11/1068 714/758 |
| 2014/0331237 A1* | 11/2014 | Kumar | G06F 9/541 719/313 |

OTHER PUBLICATIONS

"Reset Pin Circuitry for Flash Memory Sector Protection Management" Publication No. 22278, Revision A, Amendment +1, Spansion, Advanced Micro Devices, Fujitsu, Apr. 22, 2003, 5 pages.*
"Office Action of Taiwan Counterpart Application", dated Jan. 28, 2015, p. 1-p. 5, in which the listed references were cited.
"Second Office Action of China Counterpart Application", dated Dec. 19, 2016, p. 1-p. 10, in which the listed reference was cited.

* cited by examiner

SIMULATOR AND SIMULATING METHOD FOR FLASH MEMORY BACKGROUND

CROSS-REFERENCE TO RELATED APPLICATION

This application claims the priority benefit of Taiwan application serial no. 101141022, filed on Nov. 5, 2012. The entirety of the above-mentioned patent application is hereby incorporated by reference herein and made a part of this specification.

BACKGROUND

Technology Field

The present invention is directed to a simulating method for a flash memory and a simulator using the simulating method.

Description of Related Art

Along with the widespread of digital cameras, cell phones, and MP3 players in recently years, the consumers' demand to storage media has increased drastically. A rewritable non-volatile memory module (for example, a flash memory) is one of the most adaptable storage media to aforementioned portable multimedia devices due to its many characteristics such as data non-volatility, low power consumption, small volume, and non-mechanical structure.

Typically, a flash memory is coupled to a memory controller and a command is issued from the memory controller to the flash memory. However, in some applications, the memory controller may be coupled to different memory types of flash memories, which may have different characteristics and internal operations. When an error occurs during the operation between the memory controller and the flash memory, it is difficult to figure out that the error occurs due to an operation error of the memory controller or of the flash memory. Therefore, how to produce a simulator simulating the flash memory so that the simulator can be controlled and support different memory types is one of the most important issues concerned by the technicians of this art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

According to an exemplary embodiment of the present invention, a simulating method and a simulator for a flash memory capable of enabling the simulator to support different memory types is provided.

According to an exemplary embodiment of the present invention, a simulating method for a flash memory is provided. The simulating method is applicable to a simulator. The simulator is configured to couple to a memory controller. The simulating method includes setting a predetermined response condition, providing multiple command sets, wherein each of the command sets corresponds to a memory type, receiving a first command from the memory controller, identifying a second command in the command sets according to the first command, determining whether the second command matches the predetermined response condition, obtaining a first signal corresponding to the second command according to the predetermined response condition and transmitting the first signal the memory controller.

According to another exemplary embodiment of the present invention, a simulator configured to simulate a flash memory is provided. The simulator includes a flash memory interface, a detector, a processor and a non-flash memory interface. The flash memory interface is configured to couple to a memory controller and receive a first command from the memory controller. The detector is coupled to the flash memory interface and configured to provide multiple command sets and identify a second command in the command sets according to the first command, wherein each of the command sets corresponds to a memory type. The processor is coupled to the detector. The non-flash memory interface is coupled to the processor and configured to couple to a data processing unit. The data processing unit is configured to set a predetermined response condition and determine whether the second command matches the predetermined response condition. The processor is configured to obtain a first signal corresponding to the second command according to the predetermined response condition and transmit the first signal to the memory controller.

To sum up, the simulating method and the simulator provided according to the exemplary embodiments of the present invention may support different memory types and update the command sets corresponding to each memory type.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
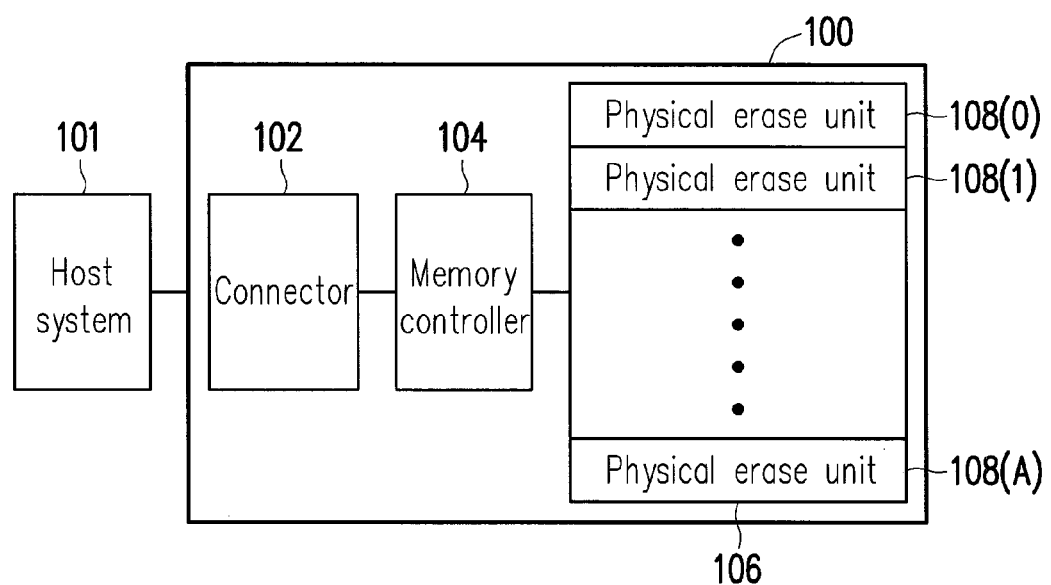
FIG. 1 is a schematic block diagram illustrating a memory storage apparatus.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (also referred to as a memory storage system) includes a rewritable non-volatile memory module and a memory controller (also referred to as a control circuit). A memory storage apparatus is usually used with a host system so that the host system can write data into or read data from the memory storage device.

FIG. 1 is a schematic block diagram illustrating a memory storage apparatus.

Referring to FIG. 1, a memory storage apparatus 100 includes a connector 102, a memory controller 104 and a rewritable non-volatile memory module 106.

The connector 102 is configured to couple to a host system 101. The host system 101 issues commands to the memory storage apparatus 100. In the present exemplary embodiment, the connector 102 complies with the serial advanced technology attachment (SATA) standard. However, it should be understood that the invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the secure digital (SD) interface standard, the ultra high speed-I (UHS-I) interface standard, the ultra high speed-II (UHS-II) interface standard, the memory stick (MS) interface standard, the MMC interface standard, the embedded multimedia card (eMMC) interface standard, the universal flash storage (UFS) interface standard, the compact flash (CF) interface standard, the integrated device electronics (IDE) standard, or any other suitable standard.

The memory controller 104 is configured to execute a plurality of logic gates or control instructions implemented in a hardware form or a firmware form and perform various data operations, such as data write, data read, data erase and so forth, on the rewritable non-volatile memory module 106 according to commands issued by the host system 101. On the other hand, data that is about to be written to the rewritable non-volatile memory module 106 is transformed to an acceptable format of the rewritable non-volatile memory module 106 via the memory controller 104.

The rewritable non-volatile memory module 106 (also referred to as a flash memory) is coupled to the memory controller 104 and configured to store data written by the host system 1000. The rewritable non-volatile memory module 106 has physical erase units 108(0)~108(A). For example, the physical erase units 108(0)~108(A) may belong to a same memory die or different memory dies. Each of the physical erase units has a plurality of physical program units, and the physical program units belonging to the same physical erase unit may be individually written but have to be erased all together. For instance, each of the physical erase units may be composed of 128 physical program units; however, the invention is not limited thereto, and each of the physical erase units may also be composed of 64, 256, or any other number of physical program units.

In detail, the physical erase unit is the smallest unit for erasing data. Namely, each physical erase unit contains the least number of memory cells which are erased all together. The physical program unit is the smallest unit for programming data. Namely, the physical program unit is the smallest unit for writing data. Each physical program unit usually includes a data bit area and a redundant bit area. The data bit area includes a plurality of physical access addresses for storing user data, and the redundant bit area is used for storing system data (e.g. control information and error correctig codes). In the present exemplary embodiment, the data bit area of each of the physical program units includes 4 physical access addresses, and the size of each of the physical access addresses is 512 bytes (B). However, in other exemplary embodiments, the data bit area may also include 8, 16, a greater or smaller number of physical access addresses, and the present invention is not intent to limit the size and the number of the physical access addresses. In an exemplary embodiment, the physical erase units may be physical blocks, and the physical program units may be physical pages or physical sectors, which is construed as limitations to the invention.

In the present exemplary embodiment, the rewritable non-volatile memory module 106 is a multi-level cell (MLC) NAND flash memory module (i.e., a memory cell storing data of at least 2 bits). Nevertheless, the present invention is not limited thereto, and the the rewritable non-volatile memory module 106 may also be a single-level cell (SLC) NAND flash memory module, a trinary-level cell (TLC) NAND flash memory, any other flash memory module, or any other memory module with the same characteristics.

Figure 2:
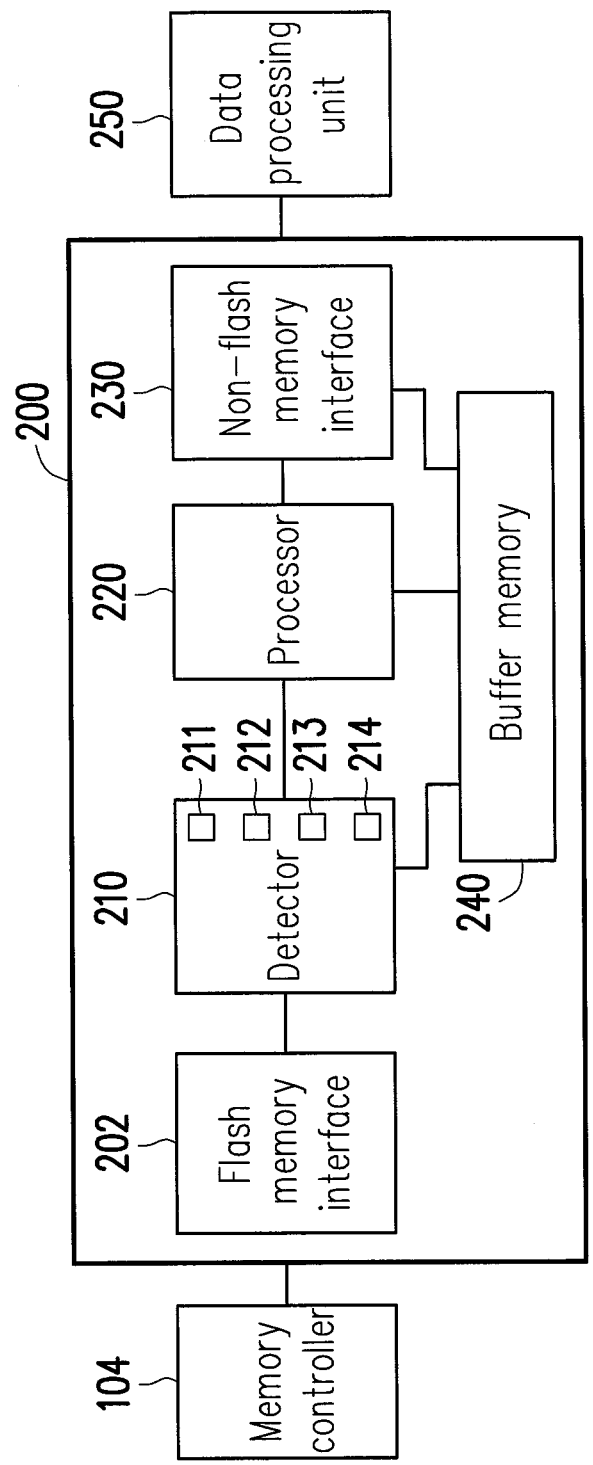
FIG. 2 is a schematic diagram illustrating a system simulating a flash memory according to an exemplary embodiment of the present invention.

FIG. 2 is a schematic diagram illustrating a system simulating a flash memory according to an exemplary embodiment of the present invention.

Referring to FIG. 2, a simulator 200 is coupled to the memory controller 104 and a data processing unit 250. The simulator 200 is configured to simulate behaviors of the rewritable non-volatile memory module 106. Specially, the simulator 200 may support different memory types. For example, the SLC-NAND flash memory module, the multi-level cell MLC-NAND flash memory module and the TLC-NAND flash memory may belong to different memory types. Or, the rewritable non-volatile memory module 106 produced by different manufacturers may belong to different memory types. It is to be notice that different memory types correspond to different command sets; however, different command sets may not be compatible with each other. For instance, a write command defined by a certain manufacturer may be different from a write command defined by another manufacturer. Nevertheless, the simulator 200 provides multiple command sets corresponding to multiple memory types, and these command sets are updatable.

The data processing unit 250 includes one or more processors and a memory unit and sets a predetermined response condition. When the data processing unit 250 receives a command from the simulator 200, the data processing unit 250 determines whether the command matches the predetermined response condition and generates a first signal according to the predetermined response condition. Additionally, the data processing unit 250 transmits the first signal to the simulator 200. For example, the predetermined response condition is set as generating a response of write failure for an nth write command, wherein n is a positive integer. When the data processing unit 250 receives a write command from the simulator 200, and the write command is to write data to a physical program unit, the data processing unit 250 determines whether the write command is an nth command received from the simulator 200 according to the predetermined response condition. If the write command is the nth command, the data processing unit 250 generates a first message representing write failure and transmits the first message to the simulator 200. However, the data processing unit 250 may also set other predetermined response conditions and generate a message of read failure, read success or write success according to the predetermined response condition, and the present invention is not limited thereto. It is to be noticed that in the present exemplary embodiment, the data processing unit 250 may not perform an actual write procedure but directly reply the write failure, or alternatively, the data processing unit 250 does not have the physical program units, and the first message representing the write failure is resulted from the simulation.

To be specific, the simulator 200 includes a flash memory interface 202, a detector 210, a processor 220, a non-flash memory interface 230 and a buffer memory 240.

The flash memory interface 202 is configured to couple to the memory controller 104. For example, the flash memory interface 202 may include one or more pins or at least one bus. The memory controller 104 is configured to enable the pins and place the data on the bus so as to transmit a command to the simulator 200.

The detector 210 is coupled to the flash memory interface 202. The detector 210 is configured to receive a command (also referred to as a first command) from the memory controller 104 and identify a second command in the multiple command sets provided by the simulator 200 according to the first command. For instance, the detector 210 includes sub-units 211~214. Each of the sub-units 211~214 corresponds to a command set, and each of the command sets includes multiple commands. After the first command is received by the detector 210, the sub-unit 211 determines whether the first command matches one of the commands corresponding to the sub-unit 211. Likewise, the sub-units 212~214 also determine whether the first command matches one of the commands corresponding thereto, respectively. However, in other embodiments, the detector 210 may include a greater or smaller number of sub-units, and the present invention is not limited thereto.

The processor 220 is configured to control the entire operation of the simulator 200. For instance, the processor 220 is a micro-processor. However, in other embodiments, the processor 220 may also be a programmable controller, an application specific integrated circuit (ASIC) or a programmable logic device (PLD).

The non-flash memory interface 230 is coupled to the processor 220 and configured to couple to the data processing unit 250. In the present exemplary embodiment, the non-flash memory interface 230 complies with the USB standard. However, in other exemplary embodiments, the non-flash memory interface 230 may also comply with the PATA standard, the IEEE 1394 standard, the PCI Express standard, the SATA standard, the SD interface standard, the UHS-I interface standard, the UHS-II interface standard, the MS interface standard, the MMC interface standard, the eMMC interface standard, the UFS interface standard, the CF interface standard, the IDE standard, or any other applicable standard of wireless communication (e.g. the WiFi or the Bluetooth communication).

The buffer memory 240 is coupled to the detector 210 processor 220 and the non-flash memory interface 230 and configured to store data or commands. In the present exemplary embodiment, the simulator 200 may be a chip such that the flash memory interface 202, the detector 210, the processor 220, the non-flash memory interface 230 and the buffer memory 240 are packaged in the chip by a system-on-a-chip (SoC) or a system-in-package (SiP) method.

After the simulator 200 is coupled to the memory controller 104, the processor 220 exchanges messages with the memory controller 104 through the flash memory interface 202. For instance, the processor 220 determines a memory type to be simulated by the simulator 200 and transmits identification information of the memory type to the memory controller 104 such that the memory controller 104 determines whether the simulator 200 is a SLC-type or a MLC-type flash memory according to the identification information. Alternatively, the memory controller 104 may obtain a manufacture identification code of a flash memory according to the identification information. After obtaining the identification information, the memory controller 104 transmits a command which matches the memory type simulated by the simulator 200 to the simulator 200.

The memory controller 104 transmits a command to the simulator 200 through the pins and the bus on the flash memory interface 202. For example, the memory controller 104 enables a write pin and transmits a command identification code on the bus. After detecting that the write pin is enabled, the simulator 200 reads the command identification code from the bus. Then, the memory controller 104 transmits a memory address and the first data which is to be written through the bus to the simulator 200, and thereby, the memory controller 104 is capable of transmitting a write command to the simulator 200. In other words, the write command includes a command identification code field, a memory address field and a data field which respectively store the command identification code, the memory address and the first data. After a command is received by the simulator 200, the sub-units 211~214 identify whether the command matches the corresponding command set.

Figure 3:
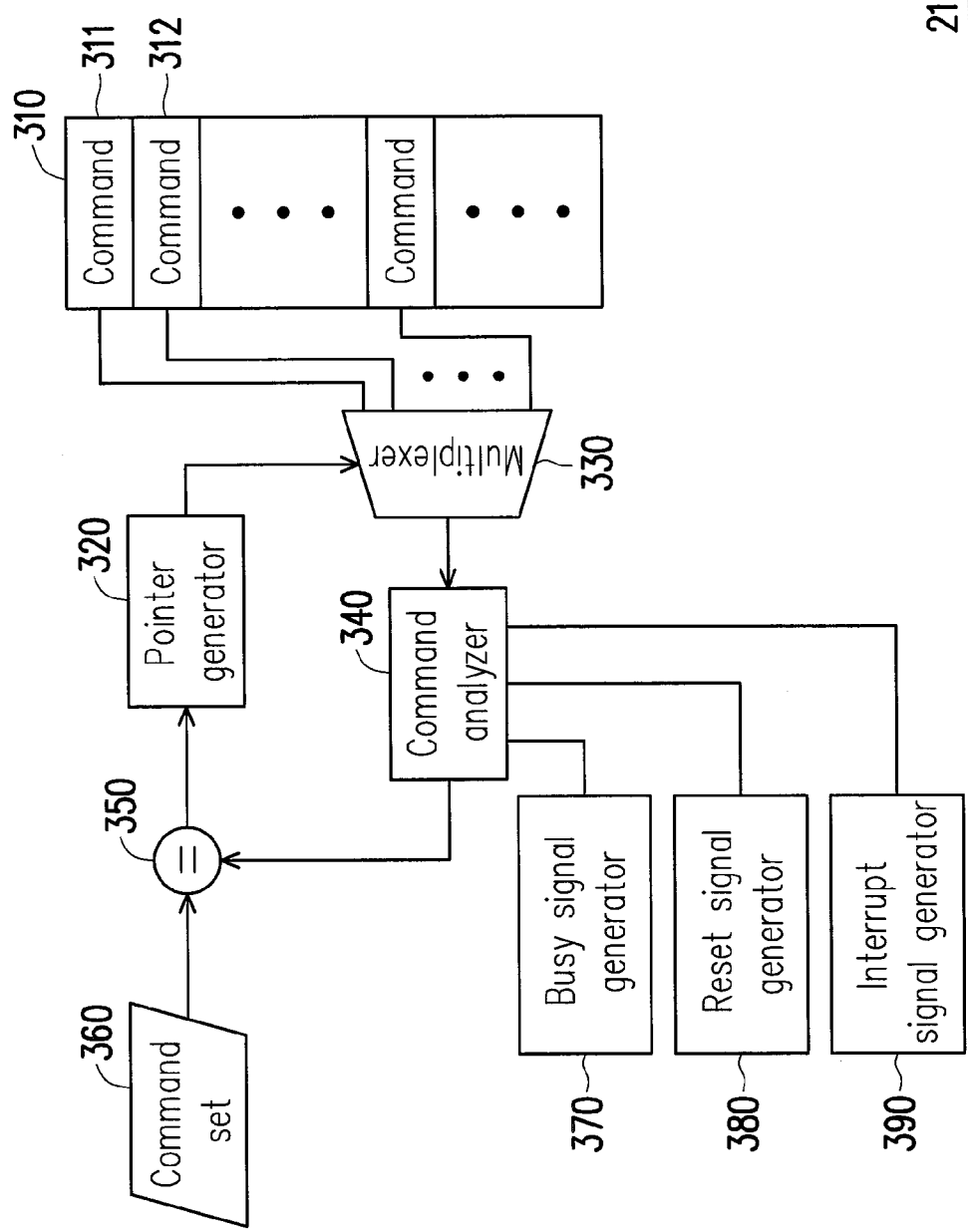
FIG. 3 is a schematic diagram of operating a sub-unit according to an exemplary embodiment of the present invention.

FIG. 3 is a schematic diagram of operating a sub-unit according to an exemplary embodiment of the present invention.

With reference to FIG. 3, the sub-unit 211 corresponds to a certain memory type, and a command set 360 includes multiple commands corresponding to the memory type. The sub-unit 211 includes a pointer generator 320, a multiplexer 330, a command analyzer 340, a comparator 350, a busy signal generator 370, a reset signal generator 380 and an interrupt signal generator 390. The multiplexer 330 is coupled to the pointer generator 320, the command analyzer 340 is coupled to the multiplexer 330, and the comparator 350 is coupled to the command analyzer 340 and the pointer generator 320.

If the sub-unit 211 receives a command from the memory controller 104, the sub-unit 211 pushes the command into a queue 310. For example, the sub-unit 211 receives a command 311 first and then a command 312. A sequence of the command 312 is after a sequence of the command 311 in the queue. In the present exemplary embodiment, the queue 310 is stored in the buffer memory 240. However, in other exemplary embodiments, the queue 310 may also be stored in a memory of the sub-unit 211, and the present invention is not limited thereto.

The pointer generator 320 generates a pointer. The multiplexer 330 selects a command from the queue 310 according to the pointer and transmits the selected command to the command analyzer 340. Here, it is assumed that the command 311 is selected by the multiplexer 330. Then, the command analyzer 340 analyzes the command 311 to generate an analyzed result. For instance, the command analyzer 340 may determine that the command 311 includes a command identification code field, a memory address field and a data field. The command analyzer 340 transmits the analyzed result to the comparator 350. The comparator 350 determines whether the command 311 matches one of the multiple commands (also referred to as third commands) included in the command set 360 according to the analyzed result. For example, the comparator 350 may determine whether a command identification code of each command in the command set 360 is identical to the command identification code of the command 311. The comparator 350 may further determine whether a command in the command set 360 has a corresponding memory address field and a corresponding data field. If the comparator 350 determines that the command 311 matches one (also referred to as a second command) of the commands in the command set 360, the comparator 350 drives the pointer generator 320 to update the pointer (for example, by adding 1 to the pointer), and the updated pointer points to a next command (e.g. the command 312) in the queue 310. If the comparator 350 determines that the command 311 does not match any one of the commands in the command set 360, the pointer generator 320 maintains the pointer unchanged.

In addition, if the comparator 350 determines that the command 311 matches the second command in the command set 360, the busy signal generator 370, the reset signal generator 380 and the interrupt signal generator 390 generate corresponding signals. For example, if the command 311 matches a write command in the command set 360, the busy signal generator 370 generates a busy signal and transmits the generated busy signal to the memory controller 104 which is configured to indicate that the simulator 200 is processing a command and not available to receive other signals. Besides, the reset signal generator 380 generates a reset signal which is configured to instruct the command analyzer 340 to start to identify the next command in the queue 310. For example, the reset signal may be configured to change a parameter or a pointer in the sub-unit 211. On the other hand, the interrupt signal generator 390 generates an interrupt signal which is configured to be transmitted to the data processing unit 250 in order to notify the data processing unit 250 that the second command is being identified.

Returning to FIG. 2, if the command identified by the detector 210 is a write command, the processor 220 stores the first data to be written by the write command in the buffer memory 240, and the processor 220 also transmits the interrupt signal generated by the interrupt signal generator 390, the write command and a memory address (also referred to as a first memory address) to be written by write command to the data processing unit 250. The data processing unit 250 determines whether the write command matches the predetermined response condition and generates a first signal according to the predetermined response condition. The data processing unit 250 transmits the first signal to the processor 220. Meanwhile, the data processing unit 250 sends a read command to the non-flash memory interface 230 so as to read the first data from the buffer memory 240. The data processing unit 250 stores the first data in a memory unit (e.g. a volatile memory or a hard disk) of the data processing unit 250. Then, the detector 210 enables a ready/busy pin in the flash memory interface 202, and after the memory controller 104 detects that the ready/busy pin is enabled, the memory controller 104 may continue to issue another command to the simulator 200.

On the other hand, if the command identified by the detector 210 is a read command, the processor 220 transmits the interrupt signal generated by the interrupt signal generator 390, the read command and a memory address (also referred to as a second memory address) to be read by the read command to the data processing unit 250. After receiving the read command, the data processing unit 250 determines whether the read command matches the predetermined response condition and generates the first signal according to the predetermined response condition. Additionally, the data processing unit 250 also obtains second data corresponding to the second memory address. For example, the data processing unit 250 records data corresponding to each memory address in a memory unit for the data processing unit 250 to obtain the second data from the memory unit based on the second memory address. Then, the data processing unit 250 issues a write command to the non-flash memory interface 230 so as to write the second data to the buffer memory 240. The detector 210 enables the ready/busy pin in the flash memory interface 202. The memory controller 104 enables a read pin in the flash memory interface 202 if detecting that the ready/busy pin is enabled. Thus, the detector 210 transmits the second data to the memory controller 104 through the flash memory interface 202.

In another exemplary embodiment, the steps executed by the data processing unit 250 are executed by the processor 220, and the data processing unit 250 is implemented as an external memory. In the meantime, the processor 220 stores the first data to be written by the write command in the external memory.

Figure 4:
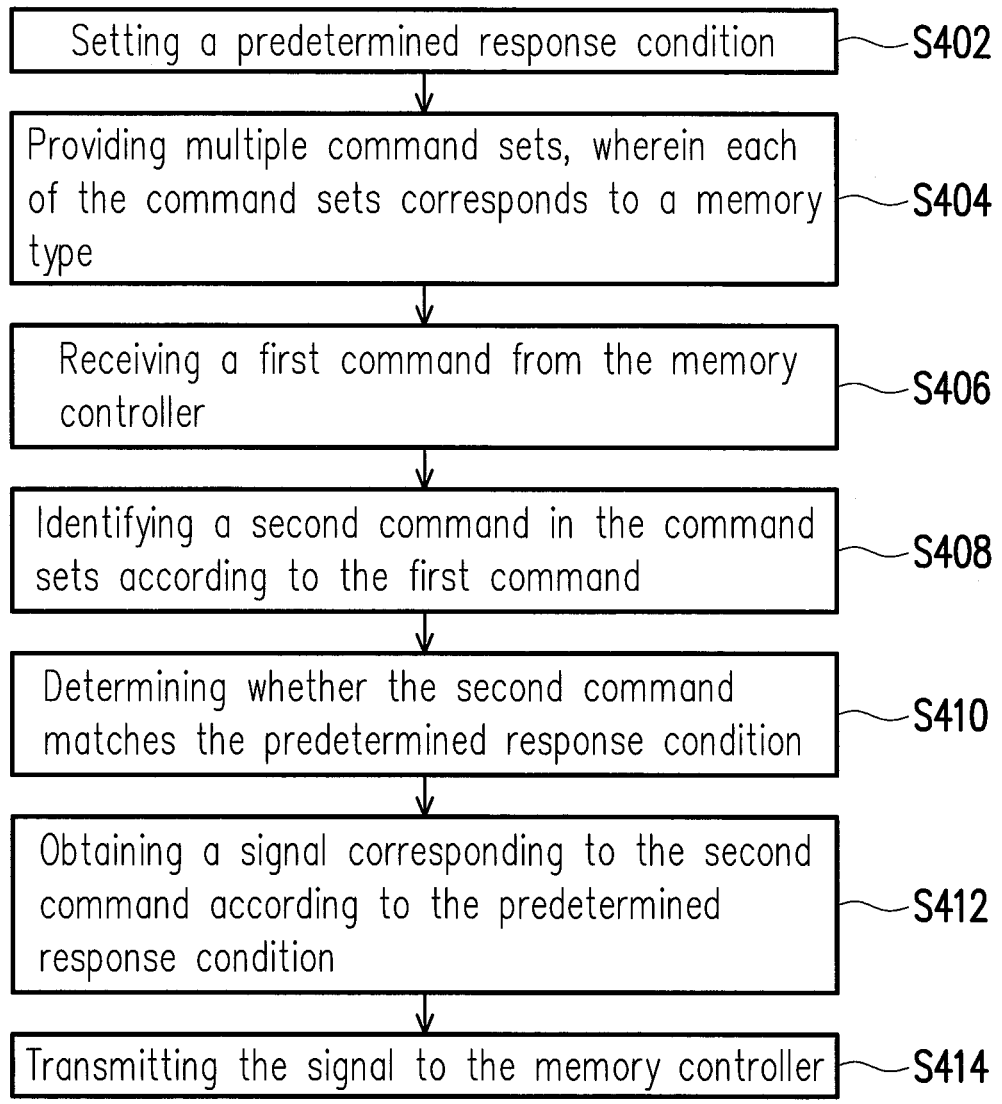
FIG. 4 is a flowchart illustrating a simulating method for a flash memory according to an exemplary embodiment of the present invention.

FIG. 4 is a flowchart illustrating a simulating method for a flash memory according to an exemplary embodiment of the present invention.

Referring to FIG. 4, in step S402, a predetermined response condition is set. In S404, multiple command sets are provided, wherein each of the command sets corresponds to a memory type. In step S406, a first command is received from the memory controller. In step S408, a second command in the command sets is identified according to the first command. In step S410, whether the predetermined response condition is matched is determined. In step S412, a signal corresponding to the second command is obtained according to the predetermined response condition. In step S414, the signal is transmitted to the memory controller.

It is to be noticed that in the present exemplary embodiment, steps S402, S410 and S412 may be executed by the data processing unit 250 or the processor 220 and each step illustrated in FIG. 4 may be executed in other execution sequences (for example, step S402 may be executed after step S408), and the present invention is not limited thereto. However, each step illustrated in FIG. 4 has been described in the above and will not be repeated hereinafter.

Base on the above, the simulating method and the simulator provided according to the exemplary embodiments of the present invention can support different memory types, and the command sets of the memory types may be updated. In addition, the signal responded to the memory controller is generated according to the predetermined response condition. Accordingly, the usage of the simulator may be more flexible. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A simulating method for a flash memory, applicable to a simulator, wherein the simulator comprises a flash memory interface coupled to a memory controller, a detector coupled to the flash memory interface, a processor coupled to the detector and a non-flash memory interface coupled to the processor and a data processing unit, the simulating method comprising:
   setting, by the data processing unit, a predetermined response condition;
   providing, by the detector, a plurality of command sets, wherein each of the command sets comprises multiple commands and corresponds to a memory type;
   receiving, by the flash memory interface, a first command from the memory controller;
   if the first command matches one of the multiple commands, identifying, by the detector, a second command in the command sets according to the first command;
   receiving, by the data processing unit, the second command transmitted from the processor through the non-flash memory interface after the detector identifies the second command,
   determining, by the data processing unit, whether the second command matches the predetermined response condition;
   obtaining, by the processor, a first signal, which is transmitted from the data processing unit through the non-flash memory interface, corresponding to the second command according to the predetermined response condition; and
   transmitting, by the processor, the first signal to the memory controller.

2. The simulating method according to claim 1, wherein the second command is a write command configured to instruct to write first data to a first memory address, the simulating method further comprising:
   storing the first data in a buffer memory in the simulator;
   transmitting an interrupt signal, the write command and the first memory address to the data processing unit through the non-flash memory interface of the simulator, wherein the data processing unit is configured to generate the first signal according to the predetermined response condition; and
   reading the first data from the buffer memory through the non-flash memory interface and storing the first data in the data processing unit by the data processing unit.

3. The simulating method according to claim 1, wherein the second command is a read command configured to instruct to read from a second memory address, the simulating method further comprising:
   transmitting an interrupt signal, the read command and the second memory address to the data processing unit through the non-flash memory interface of the simulator, wherein the data processing unit is configured to generate the first signal according to the predetermined response condition; and
   writing second data corresponding to the second memory address to a buffer memory in the simulator through the non-flash memory interface by the data processing unit.

4. The simulating method according to claim 1, further comprising:
   providing the memory controller with identification information of one of the memory types, wherein the first command belongs to the one of the memory types in the step of receiving the first command from the memory controller.

5. The simulating method according to claim 1, wherein the command sets comprise a first command set comprising a plurality of third commands, and the step of identifying the second command in the command sets according to the first command comprises:
   obtaining the first command from a queue according to a pointer;
   determining whether the first command matches one of the third commands;
   if the first command matches one of the third commands, updating the pointer, wherein the third command matched by the first command is the second command; and
   if the first command does not match any one of the third commands, maintaining the pointer unchanged.

6. The simulating method according to claim 5, further comprising:
   if the first command matches one of the third commands, generating a reset signal configured to instruct a command analyzer to start to identify a fourth command in the queue, wherein a sequence of the fourth command is after a sequence of the first command in the queue.

7. The simulating method according to claim 5, further comprising:
   if the first command matches one of the third commands, transmitting a busy signal to the memory controller.

8. The simulating method according to claim 5, further comprising:
   if the first command matches one of the third commands, transmitting an interrupt signal to the data processing unit to notify the data processing unit that the second command is being identified.

9. A simulator, configured to simulate a flash memory, the simulator comprising:
   a flash memory interface, configured to couple to a memory controller and receive a first command from the memory controller;
   a detector, coupled to the flash memory interface and configured to provide a plurality of command sets, wherein each of the command sets comprises multiple commands and corresponds to a memory type,
   wherein the detector is configured to identify a second command in the command sets according to the first command if the first command matches one of the multiple commands;
   a processor, coupled to the detector; and
   a non-flash memory interface, coupled to the processor and configured to couple to a data processing unit,
   wherein the data processing unit is configured to set a predetermined response condition,
   wherein the data processing unit is further configured to receive the second command transmitted from the processor through the non-flash memory interface after the detector identifies the second command,
   wherein the data processing unit is further configured to determine whether the second command matches the predetermined response condition, and
   wherein the processor is configured to obtain a first signal, which is transmitted from the data processing unit through the non-flash memory interface, corresponding to the second command according to the predetermined response condition and transmit the first signal to the memory controller.

10. The simulator according to claim 9, wherein the second command is a write command configured to instruct to write first data to a first memory address, the simulator further comprising:
   a buffer memory,
   wherein the processor is further configured to store the first data in the buffer memory and transmit an interrupt signal, the write command and the first memory address to the data processing unit through the non-flash memory interface, and
   wherein the data processing unit is configured to read the first data from the buffer memory through the non-flash memory interface and store the first data in the data processing unit.

11. The simulator according to claim 9, wherein the second command is a read command configured to instruct to read from a second memory address, the simulator further comprising:
   a buffer memory,
   wherein the processor is configured to transmit an interrupt signal, the read command and the second memory address to the data processing unit through the non-flash memory interface, and the data processing unit is configured to write second data corresponding to the second memory address to the buffer memory through the non-flash memory interface.

12. The simulator according to claim 9, wherein the processor is further configured to provide the memory controller with identification information of one of the memory types.

13. The simulator according to claim 9, wherein the command sets comprise a first command set comprising a plurality of third commands, and the detector comprises a sub-unit which comprises:
   a pointer generator, configured to generate a pointer;
   a multiplexer, coupled to the pointer generator and configured to obtain the first command from a queue according to the pointer;
   a command analyzer, coupled to the multiplexer and configured to analyze the first command to generate a analyzed result; and
   a comparator, coupled to the command analyzer and the pointer generator and configured to determine whether the first command matches one of the third commands according to the analyzed result,
   wherein if the first command matches one of the third commands, the pointer generator is configured to update the pointer, wherein the third command matched by the first command is the second command,
   wherein if the first command does not match any one of the third commands, the pointer generator is configured to maintain the pointer unchanged.

14. The simulator according to claim 13, wherein the sub-unit further comprises a reset signal generator, if the first command matches one of the third commands, the reset signal generator is configured to generate a reset signal configured to instruct the command analyzer to start to identify a fourth command in the queue, and a sequence of the fourth command is after a sequence of the first command in the queue.

15. The simulator according to claim 13, wherein the sub-unit further comprises a busy signal generator, and if the first command matches one of the third commands, the busy signal generator is configured to transmit a busy signal to the memory controller.

16. The simulator according to claim 13, wherein the sub-unit further comprises an interrupt signal generator, and if the first command matches one of the third commands, the interrupt signal generator is configured to transmit an interrupt signal to the data processing unit to notify the data processing unit that the second command is being identified.

17. The simulator according to claim 9, wherein the flash memory interface, the detector, the processor, the non-flash memory interface and the buffer memory are packaged by using a system-on-a-chip (SoC) or a system-in-package (SiP) method.

* * * * *